United States Patent
Hu

(10) Patent No.: US 11,862,545 B2
(45) Date of Patent: Jan. 2, 2024

(54) INTEGRATED SUBSTRATE STRUCTURE, ELECTRONIC ASSEMBLY, AND MANUFACTURING METHOD THEREOF

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 78 days.

(21) Appl. No.: 17/356,534

(22) Filed: Jun. 24, 2021

(65) Prior Publication Data
US 2022/0037245 A1 Feb. 3, 2022

Related U.S. Application Data

(60) Provisional application No. 63/057,307, filed on Jul. 28, 2020.

(51) Int. Cl.
*H01L 23/498* (2006.01)
*H01L 23/00* (2006.01)
(Continued)

(52) U.S. Cl.
CPC ...... *H01L 23/49833* (2013.01); *H01L 21/486* (2013.01); *H01L 21/4853* (2013.01);
(Continued)

(58) Field of Classification Search
CPC .......... H01L 23/49833; H01L 21/4853; H01L 21/486; H01L 21/4882; H01L 23/367; H01L 23/49811; H01L 24/32; H01L 24/83; H01L 25/105; H01L 24/16; H01L 2224/16227; H01L 2224/32225;
(Continued)

(56) References Cited

U.S. PATENT DOCUMENTS

2015/0340327 A1* 11/2015 Uzoh ................ H01L 21/76898
438/109
2016/0079219 A1  3/2016 Hosomi
(Continued)

OTHER PUBLICATIONS

"Office Action of Taiwan Counterpart Application", dated Mar. 17, 2022, p. 1-p. 8.

*Primary Examiner* — Selim U Ahmed
*Assistant Examiner* — Evan G Clinton
(74) *Attorney, Agent, or Firm* — JCIPRNET

(57) ABSTRACT

An integrated substrate, an electronic assembly, and manufacturing methods thereof are provided. The integrated substrate structure includes a coarse redistribution structure, fine redistribution segments, and conductive connectors. The coarse redistribution structure includes a coarse dielectric layer and a coarse circuitry embedded therein. The fine redistribution segments disposed over the coarse redistribution structure and disposed side by side and apart from one another. The respective fine redistribution segment includes a fine dielectric layer thinner than the coarse dielectric layer, and a fine circuitry embedded in the fine dielectric layer. The fine circuitry includes a dimension and a pitch finer than those of the coarse circuitry, and a layout density of the fine circuitry is denser than that of the coarse circuitry. The conductive connectors are interposed between the coarse redistribution structure and the fine redistribution segments, and the coarse circuitry is electrically coupled to the fine circuitry through the conductive connectors.

16 Claims, 18 Drawing Sheets

(51) Int. Cl.
*H01L 25/10* (2006.01)
*H01L 23/367* (2006.01)
*H01L 21/48* (2006.01)

(52) U.S. Cl.
CPC ........ *H01L 21/4882* (2013.01); *H01L 23/367* (2013.01); *H01L 23/49811* (2013.01); *H01L 24/32* (2013.01); *H01L 24/83* (2013.01); *H01L 25/105* (2013.01); *H01L 24/16* (2013.01); *H01L 2224/16227* (2013.01); *H01L 2224/32225* (2013.01)

(58) Field of Classification Search
CPC . H01L 2224/16145; H01L 2224/16146; H01L 25/16; H01L 25/0657; H01L 2224/16225; H01L 23/49816; H01L 23/5383; H01L 23/5385
See application file for complete search history.

(56) References Cited

U.S. PATENT DOCUMENTS

| | | | |
|---|---|---|---|
| 2016/0095207 A1* | 3/2016 | Taniguchi | H05K 3/4691 174/252 |
| 2017/0084548 A1* | 3/2017 | Hu | H01L 23/49822 |
| 2020/0118898 A1 | 4/2020 | Hu | |
| 2020/0118908 A1* | 4/2020 | Yu | H01L 23/3677 |
| 2021/0225666 A1* | 7/2021 | Lin | H01L 21/563 |
| 2021/0327796 A1* | 10/2021 | Chen | H05K 1/14 |
| 2021/0366814 A1* | 11/2021 | Hou | H01L 23/49861 |
| 2021/0391411 A1* | 12/2021 | Park | H01L 23/49822 |

\* cited by examiner

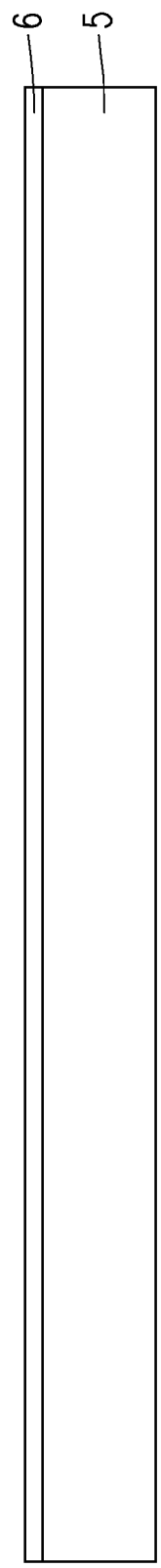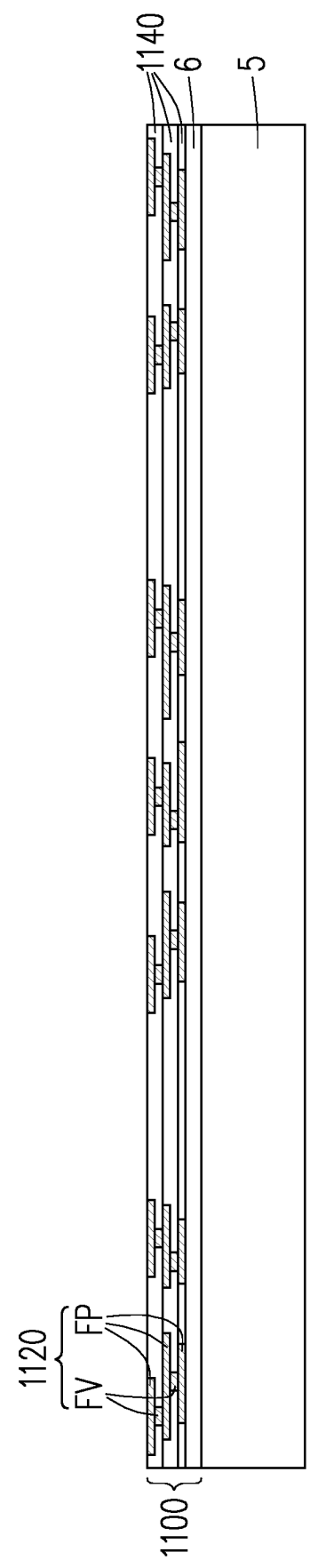

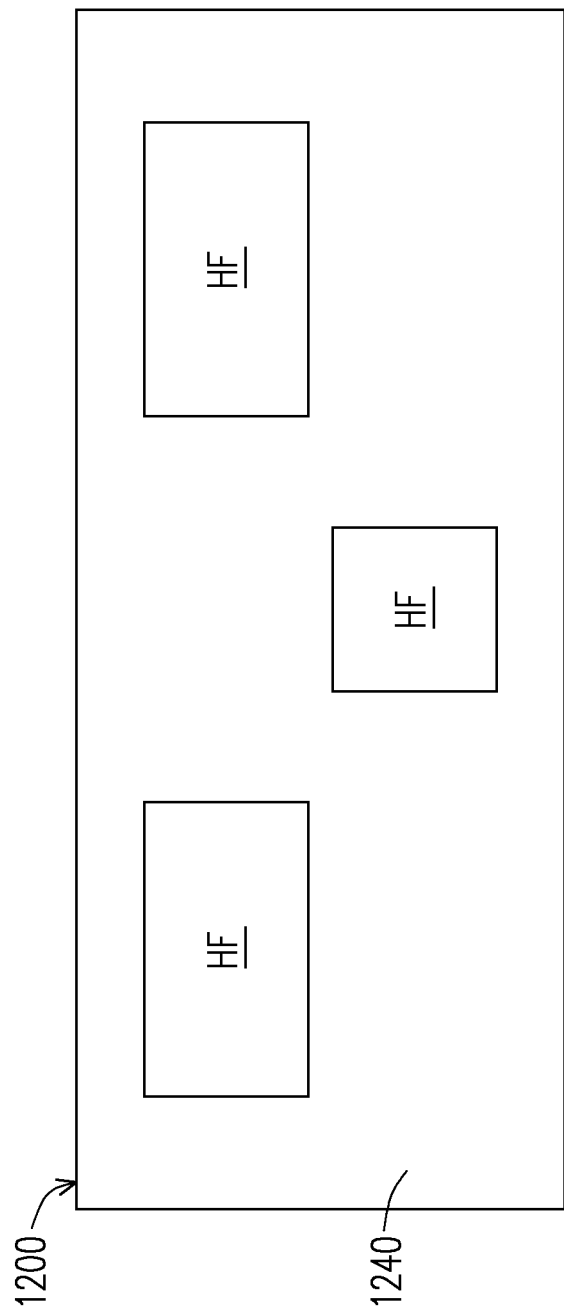
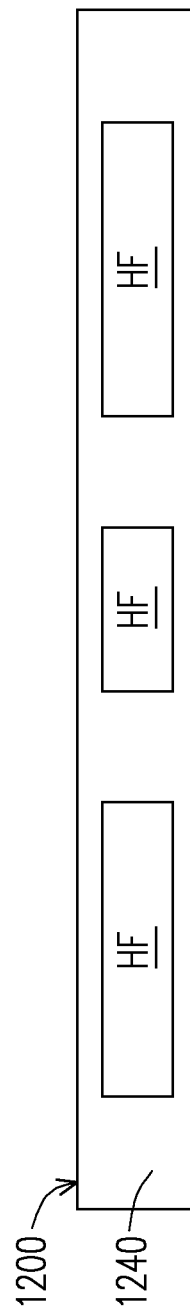
FIG. 6A
FIG. 6B

INTEGRATED SUBSTRATE STRUCTURE, ELECTRONIC ASSEMBLY, AND MANUFACTURING METHOD THEREOF

CROSS REFERENCE TO RELATED APPLICATION

This application claims the priority benefit of U.S. provisional application Ser. No. 63/057,307, filed on Jul. 28, 2020. The entirety of the above-mentioned patent application is hereby incorporated by reference herein and made a part of specification.

BACKGROUND OF THE INVENTION

1. Field of the Invention

The present invention relates to a semiconductor substrate, and more specifically relates to an integrated substrate structure with large format.

2. Description of Related Art

In packaging applications, multiple chips need to be placed on the substrate for performing various functions. This would require use of a larger substrate. However, the large sized substrate is either not readily manufactured or would require a specialized process which will significantly increase costs and likely lower yield. Therefore, a need exists to provide a large-format substrate for multiple chips mounted thereon.

In addition, current trends in integrated circuit (IC) structure design are increasing IC structure functionality and shrinking IC structure size. These trends are leading to an increase in the power dissipation requirements of IC structure. For this reason, a need exists to provide an integrated substrate that includes heat dissipation features for cooling the chips mounted on the integrated substrate.

SUMMARY OF THE INVENTION

The invention provides an integrated substrate structure which includes a coarse redistribution structure, a plurality of fine redistribution segments, and a plurality of conductive connectors. The coarse redistribution structure includes a coarse dielectric layer and a coarse circuitry embedded in the coarse dielectric layer. The fine redistribution segments are disposed over the coarse redistribution structure and coupled to the fine-pitched chip, and the fine redistribution segments are disposed side by side and spatially apart from one another. Each of the plurality of fine redistribution segments includes a fine dielectric layer thinner than the coarse dielectric layer, and a fine circuitry embedded in the fine dielectric layer. The fine circuitry includes a dimension and a pitch finer than those of the coarse circuitry of the coarse redistribution structure, and a layout density of the fine circuitry being denser than a layout density of the coarse circuitry. The conductive connectors are interposed between the coarse redistribution structure and the fine redistribution segments, and the coarse circuitry is electrically coupled to the fine circuitry through the conductive connector.

In some embodiments, the integrated substrate structure further includes an embedded chip and an underfill layer, where the embedded chip is interposed between the coarse redistribution structure and one of the fine redistribution segments, and the embedded chip is physically and electrically connected to the fine circuitry of the one of the fine redistribution segments, the underfill layer is interposed between the coarse redistribution structure and the one of the fine redistribution segments, and the embedded chip and the conductive connectors surrounding the embedded chip are embedded in the underfill layer. In some embodiments, each of the conductive connectors which surrounds the embedded chip includes a conductive pillar and a solder joint underlying the conductive pillar and physically and electrically connected to the coarse circuitry of the coarse redistribution structure, where the conductive pillar is physically and electrically connected to the fine circuitry of the one of the fine redistribution segments. In some embodiments, the integrated substrate structure further includes a plurality of insulating segments spatially apart from one another, where each of the fine redistribution segments is encapsulated by one of the insulating segments, and the insulating segments are spatially apart from the coarse redistribution structure.

In some embodiments, one of the fine redistribution segments includes a top surface, a bottom surface opposite to the top surface, and a sidewall connected to the top surface and the bottom surface, and a corresponding one of the insulating segments covers the sidewall and the bottom surface of the one of the fine redistribution segments, and the conductive connectors which are connected to the bottom surface of the one of the fine redistribution segments are embedded in the corresponding one of the insulating segments. In some embodiments, the top surface of the one of the fine redistribution segments is substantially coplanar with the top surface of the one of the fine redistribution segments. In some embodiments, the integrated substrate structure further includes an embedded chip and an underfill layer interposed between the coarse redistribution structure and the one of the insulating segments, where the embedded chip is interposed between the coarse redistribution structure and one of the fine redistribution segments and embedded inside one of the insulating segments, and the embedded chip is physically and electrically connected to the fine circuitry of the one of the fine redistribution segments.

In some embodiments, the integrated substrate structure further includes a heat-dissipating feature embedded inside the coarse redistribution structure, where the coarse circuitry includes coarse conductive patterns stacked upon one another and a conductive through via vertically connected the coarse conductive patterns, and the conductive through via penetrates through the heat-dissipating feature which is laterally covered by the coarse dielectric layer. In some embodiments, the coarse redistribution structure includes a top side and a bottom side, a portion of the fine redistribution segments is disposed at the top side of the coarse redistribution structure, and another portion of the fine redistribution segments is disposed at the bottom side of the coarse redistribution structure. In some embodiments, the integrated substrate structure further includes an embedded chip and an underfill layer interposed between the coarse redistribution structure and the one of the fine redistribution segments, where the embedded chip is interposed between the coarse redistribution structure and one of the fine redistribution segments is disposed at the top side, and the embedded chip is physically and electrically connected to the fine circuitry of the one of the fine redistribution segments, and the embedded chip and the conductive connectors surrounding the embedded chip are embedded in the underfill layer.

The invention provides an electronic assembly includes an integrated substrate structure described above, a chip structure disposed on and electrically connected to one of the fine redistribution segments of the integrated substrate structure, and a power supply module disposed below and electrically coupled to the coarse redistribution structure.

The invention further provides a manufacturing method of an integrated substrate structure that includes at least the following steps. A fine redistribution structure is formed over a temporary carrier. A plurality of first trenches is formed in the fine redistribution structure to form a plurality of fine redistribution segments. A coarse redistribution structure is coupled to the fine redistribution segments through a plurality of conductive connectors, where a size of the coarse redistribution structure is greater than a size of the fine redistribution segments. The temporary carrier is removed from the fine redistribution segments after the coupling.

In some embodiments, the method further includes forming a plurality of conductive pillars on the fine redistribution structure before forming the first trenches, coupling a chip to one of the fine redistribution segments, forming an insulating material over the temporary carrier to cover the fine redistribution segments, the conductive pillars, and the chip, and forming a plurality of second trenches in the insulating material to form a plurality of insulating segments, where each of the insulating segments covers one of the fine redistribution segments. In some embodiments, each of the second trenches is formed at a location within one of the first trenches, and sidewalls of the fine redistribution segments are covered by the insulating segments. In some embodiments, coupling the coarse redistribution structure to the fine redistribution segments includes forming a plurality of solder bumps on the coarse redistribution structure before the coupling, and attaching the solder bumps on the conductive pillars to form the conductive connectors. In some embodiments, the method further includes forming an underfill layer between the coarse redistribution structure and the one of the fine redistribution segments to surround the solder bumps.

In some embodiments, top surfaces of each of the fine redistribution segments are exposed after removing the temporary carrier, where the respective top surface includes a fine circuitry and a fine dielectric layer, and the respective top surface is substantially coplanar with a surface of a corresponding one of the insulating segments. In some embodiments, the fine redistribution structure and the coarse redistribution structure are separately formed, and the coarse redistribution structure is provided with a plurality of heat-dissipating feature embedded inside a coarse dielectric layer of the coarse redistribution structure. In some embodiments, coupling the coarse redistribution structure to the fine redistribution segments includes forming a plurality of solder balls on the coarse redistribution structure before the coupling, and attaching the solder balls on fine circuitries of the fine redistribution segments. In some embodiments, top surfaces of each of the fine redistribution segments are exposed after removing the temporary carrier, where the respective top surface comprises a fine circuitry and a fine dielectric layer.

Based on the above, the integrated substrate structure including the coarse redistribution structure and the fine redistribution segments mounted thereon may be electrically coupled to various components. The fine redistribution segments may be formed to have fine pitches so as to meet the I/O pitch requirements of various chips. The fine redistribution segments may be located at the intended locations on the coarse redistribution structure for interconnecting the chips/devices on the corresponding fine redistribution segments, thereby shortening the signal transmission path between the chips/devices. In addition, the respective fine redistribution segment may be encapsulated by the insulating segment to enhance the overall mechanical strength. Moreover, the chips/devices may be interposed between the fine redistribution segment and the coarse redistribution structure and embedded inside the underfill layer or the insulating segment to form the embedded chips/devices that may enhance the functionality of the integrated substrate structure.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A-2E are schematic cross-sectional views illustrating a manufacturing method of an integrated substrate structure according to some embodiments.

FIG. 6A is a schematic plane view of a substrate layer including heat-dissipating features in accordance with some embodiments.

FIG. 6B is a schematic cross-sectional view of the substrate layer of FIG. 6A.

DESCRIPTION OF THE EMBODIMENTS

Figure 1:
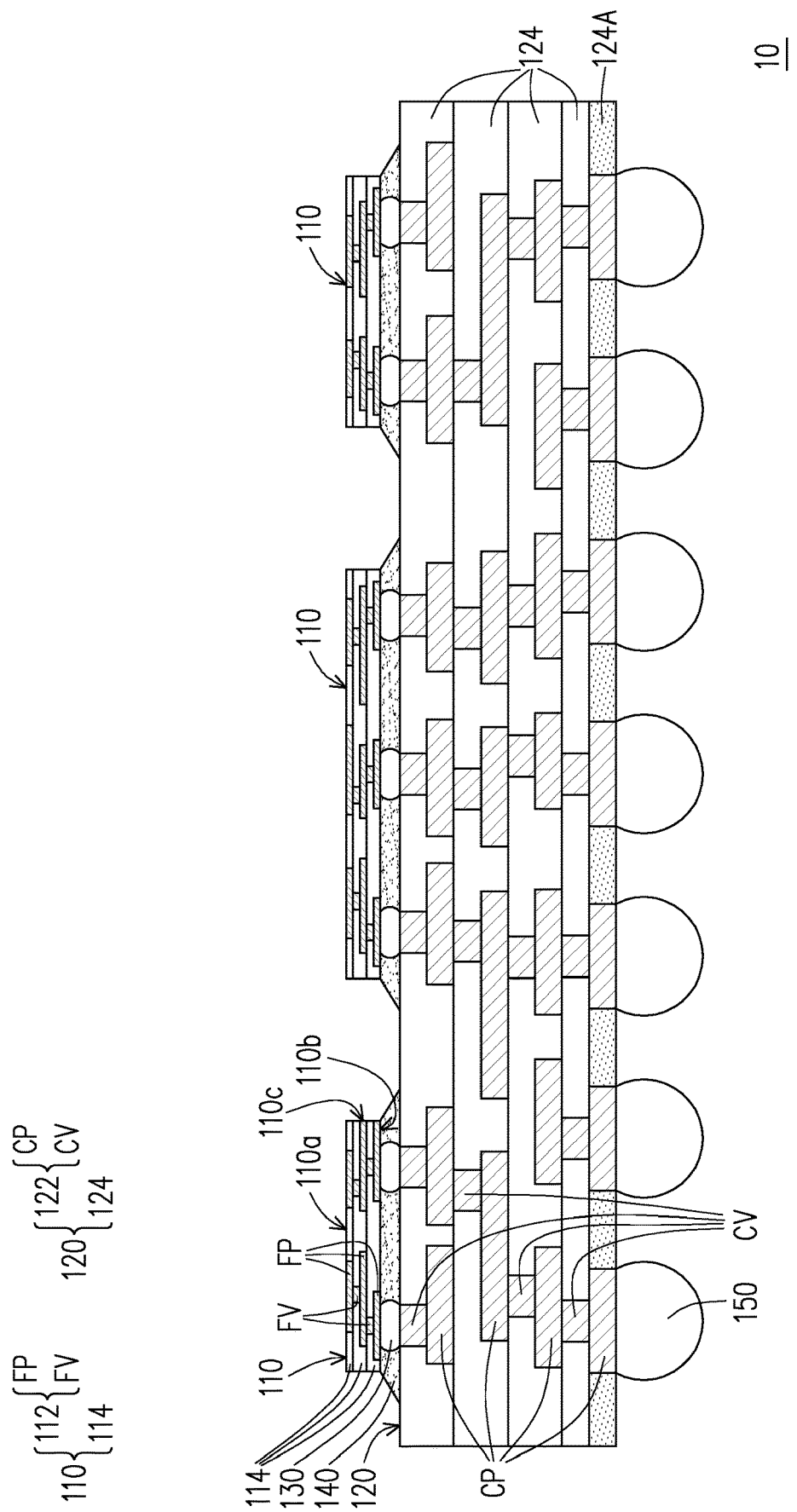
FIG. 1 is a schematic cross-sectional view of an integrated substrate structure in accordance with some embodiments.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of an integrated substrate structure in accordance with some embodiments. Referring to FIG. 1, an integrated substrate structure 10 includes a plurality of fine redistribution segments 110 mounted on a coarse redistribution structure 120. The size of the integrated substrate structure 10 may be large enough so that many chips (not shown) may be integrated simultaneously on the integrated substrate structure 10 through the fine redistribution segments 110. In some embodiments, the size of the integrated substrate structure 10 is about 80 mm×80 mm, 100 mm×100 mm, or even beyond this. Compared to a conventional substrate, the integrated substrate structure 10 is provided with a larger format for connecting various chips thereon. It should be noted that the configuration of the fine redistribution segments 110 and the coarse redistribution structure 120 are illustrated as an example, the layers of the respective fine redistribution segment and the coarse redistribution structure may be adjusted depending on product requirements.

The fine redistribution segments 110 may be spatially separated from one another, and the fine redistribution segments 110 may be electrically coupled to each other through the coarse redistribution structure 120. The spatial separation of the segments has the benefit of the heat generated from the chips on one segment is thermally decoupled from the chips on the other segments. The thermal decouple among chips has the benefit of reducing thermal stresses of the chips. This benefit can enhance the reliability of overall packaging system. In addition, the gaps between the segments can be useful for the process of filling underfill materials.

The structure in FIG. 1 is a die last solution for system integration. Hence, the overall system integration yield can be increased by known good substrate and known good dies. The respective fine redistribution segment 110 may include a fine circuitry 112 embedded in a fine dielectric layer 114. The respective fine redistribution segment 110 may include a top surface 110a, a bottom surface 110b opposite to the top surface 110a, and a sidewall 110c connected to the top surface 110a and the bottom surface 110b. For example, at least one chip (not shown) is mounted on the top surface 110a, the bottom surface 110b faces the coarse redistribution structure 120, and the sidewall 110c is substantially vertical. The topmost portion of the fine circuitry 112 at the top surface 110a may be accessibly revealed by the fine dielectric layer 114 for the chips mounted thereon. In some embodiments, the sidewall 110c includes a sidewall of the fine circuitry 112 and a sidewall of the fine dielectric layer 114 aligned with each other. The pitch of the fine circuitry 112 may match the fine-pitch requirements of chips that will be mounted on the fine redistribution segments 110.

In some embodiments, the fine circuitry 112 includes fine conductive patterns FP and fine conductive vias FV vertically connecting adjacent levels of the fine conductive patterns FP. The materials of the fine conductive patterns FP and the fine conductive vias FV may be or may include copper, gold, nickel, aluminium, platinum, tin, combinations thereof, an alloy thereof, or any suitable conductive material. In some embodiments, the fine dielectric layer 114 includes a plurality of sublayers stacked upon one another, and the respective sublayer may include the same material or different materials. The material of the fine dielectric layer 114 may be or may include polyimide (PI), benzocyclobutene (BCB), polybenzoxazole (PBO), inorganic dielectric material (e.g., silicon oxide, silicon nitride, or the like), or other suitable electrically insulating materials.

The respective coarse redistribution structure 120 may include a coarse circuitry 122 embedded in a coarse dielectric layer 124. In some embodiments, the coarse circuitry 122 includes coarse conductive patterns CP and coarse conductive vias CV connected to the adjacent levels of the coarse conductive patterns CP. The material of the coarse circuitry 122 may be similar to that of the fine circuitry 112. In some embodiments, the coarse dielectric layer 124 includes a plurality of sublayers stacked upon one another, and the respective sublayer may include the same material or different materials. For example, the coarse dielectric layers 124 are formed by lamination or other suitable deposition process and may include material such as ceramic (e.g., titanium oxide or the like), organic dielectric, or other suitable electrically insulating materials.

The respective coarse conductive pattern CP and the respective coarse conductive via CV may be coarser and thicker than the fine conductive pattern FP and the fine conductive via FV. The layout density per unit area of the fine circuitry 112 may be much finer than that of the coarse circuitry 122. The fine redistribution segments 110 may be viewed as thin film segments with high density wiring area relative to the coarse redistribution structure 120. For example, the fine conductive pattern FP has line-spacing (L/S) pitches finer than the L/S pitches of the coarse conductive pattern CP. In some embodiments, a dimension (e.g., height, depth, width, outer diameter, etc.) of the respective coarse conductive via CV is greater than that of the fine conductive via FV. The coarse dielectric layer 124 at each level may also be thicker and more rigid than the fine dielectric layer 114.

In some embodiments, the fine circuitry 112 of the respective fine redistribution segment 110 is connected to the coarse circuitry 122 through conductive connectors 130. For example, the conductive connectors 130 are solder joints coupling the fine redistribution segments 110 and the coarse redistribution structure 120. In some embodiments, underfill layers 140 are formed on the coarse redistribution structure 120 and each of the underfill layers 140 may fills a gap between the respective fine redistribution segment 110 and the underlying coarse redistribution structure 120. The conductive connectors 130 may be surrounded by the underfill layers 140 for protection. In some embodiments, the sidewall 110c of the respective fine redistribution segment 110 is partially covered by the underfill layer 140. For example, the underfill layer 140 is in direct contact with the sidewall of the fine dielectric layer 114. In some embodiments, the sidewall of the fine circuitry 112 is also in direct contact with the underfill layer 140. Alternatively, the underfill layer 140 is omitted.

In some embodiments, the fine redistribution segments 110 are mounted on one side of the coarse redistribution structure 120 and a plurality of external terminals 150 are mounted on the opposing side of the coarse redistribution structure 120. In some embodiments, the coarse redistribution structure 120 includes a mask layer 124A underlying the bottommost portion of the coarse dielectric layer 124. For example, the bottommost portion of the coarse conductive pattern CP may be accessibly exposed by the mask layer 124A, and the external terminals 150 are physically connected to the bottommost portion of the coarse conductive pattern CP. In some embodiments, the external terminals 150 are solder balls and the mask layer 124A is a solder mask. The external terminals 150 may be electrically coupled to the fine redistribution segments 110 through the coarse redistribution structure 120 and the conductive connectors 130. Alternatively, the mask layer 124A is omitted.

FIGS. 2A-2E are schematic cross-sectional views illustrating a manufacturing method of an integrated substrate structure according to some embodiments. It is noted that the resulting the integrated substrate structure described herein is similar to the integrated substrate structure 10 described in FIG. 1, and thus the same reference numbers are used in the drawings and the description to refer to the same or like parts.

Referring to FIGS. 2A-2B, a release layer 6 may be formed on a temporary carrier 5, where the release layer 6 may enhance the releasibility of the subsequently formed structure from the temporary carrier 5 in a subsequent de-bonding process. Next, a fine redistribution structure 1100 including a fine dielectric layer 1140 and a fine circuitry 1120 is formed over the temporary carrier 5 with the release layer 6 interposed therebetween. For example, the fine circuitry 1120 includes fine conductive patterns FP and fine conductive vias FV collectively viewed as the fine redistribution circuitry that is embedded in the fine dielectric layer 1140.

Figure 2C:
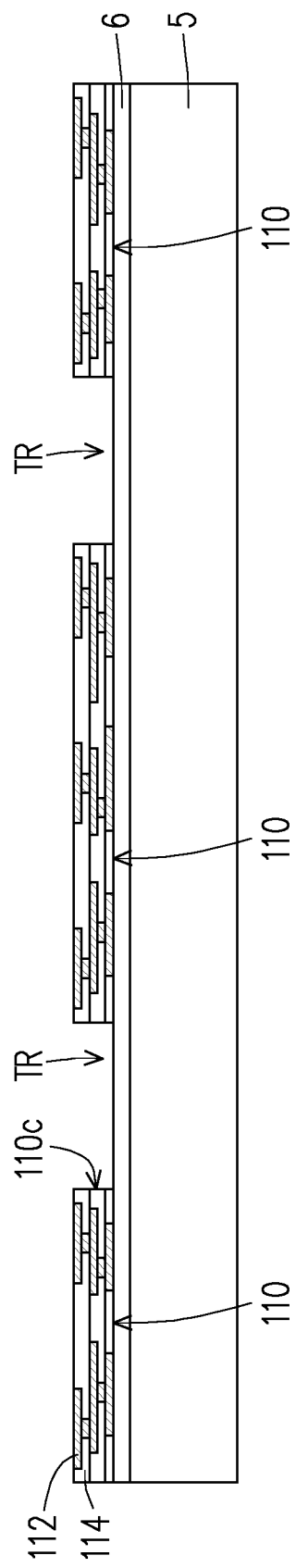

Referring to FIG. 2C and with reference to FIG. 2B, the fine redistribution structure 1100 is segmented by removing portions of the fine redistribution structure 1100 to form a plurality of trenches TR. For example, the trenches TR spatially separate the fine redistribution segments 110 from one another. In some embodiments, the trenches TR are formed at intended locations to meet the chip placement requirements. For example, laser energy (e.g., excimer laser) is applied to the fine redistribution structure 1100 to form the trenches TR. In some embodiments, the respective fine redistribution segment has a substantially vertical sidewall 110 c. Other suitable removal techniques (e.g., chemical etching, lithography and etching, etc.) may be used depending on the materials of the fine redistribution structure 1100. In some embodiments, during the removal of the portions of the fine redistribution structure 1100, portions of the release layer 6 corresponding to those portions of the fine redistribution structure 1100 are also be removed. Alternatively, the temporary carrier 5 is exposed by the trenches TR.

Figure 2D:
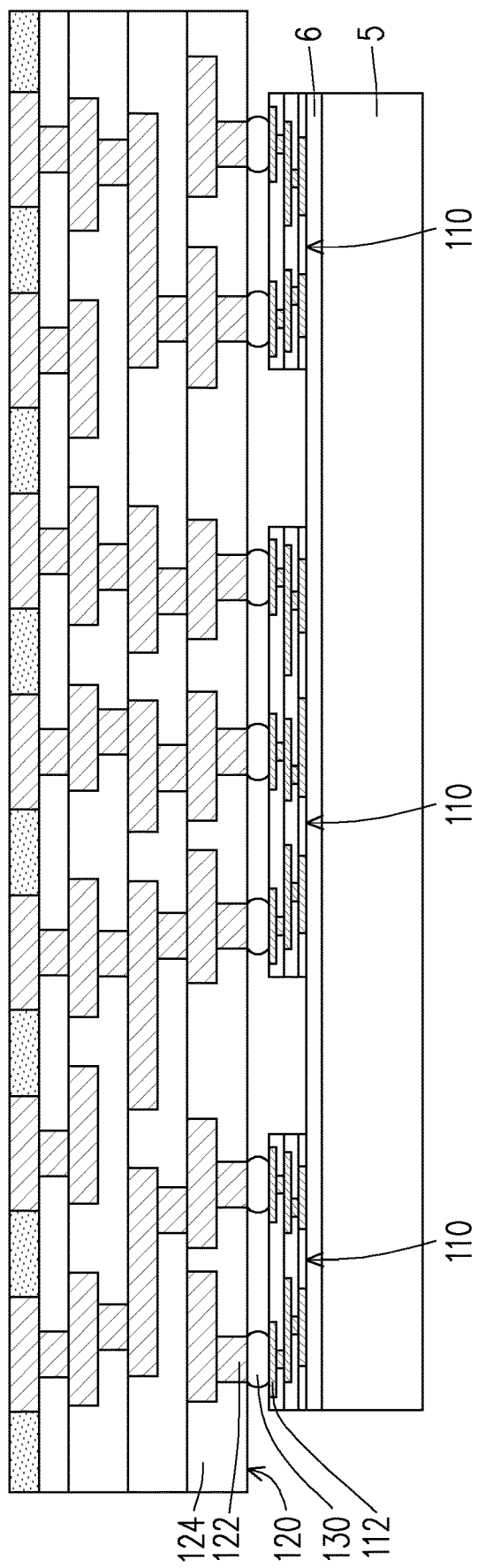

Referring to FIG. 2D, the fine redistribution segments 110 and the coarse redistribution structure 120 may be bonded together. The coarse redistribution structure 120 may include the coarse circuitry 122 and the coarse dielectric layer 124 as mentioned above. The coarse redistribution structure 120 may be much larger and wider than the temporary carrier 5 and the structure thereon. For example, a circuit-board formation process is applied to form the coarse redistribution structure 120, although other semiconductor processes may be used. In some embodiments, the fine redistribution segments 110 carried by the temporary carrier 5 are attached to the coarse redistribution structure 120 via the conductive connectors 130. In some embodiments, the conductive connectors 130 include solder material, and a reflow process may be performed to bond the coarse circuitry 122 of the coarse redistribution structure 120 to the fine circuitry 112 of the fine redistribution segments 110. Although the conductive connectors 130 may be made of other suitable bonding material(s), and other bonding techniques may also be used to mount the coarse redistribution structure 120 on the fine redistribution segments 110.

Figure 2E:
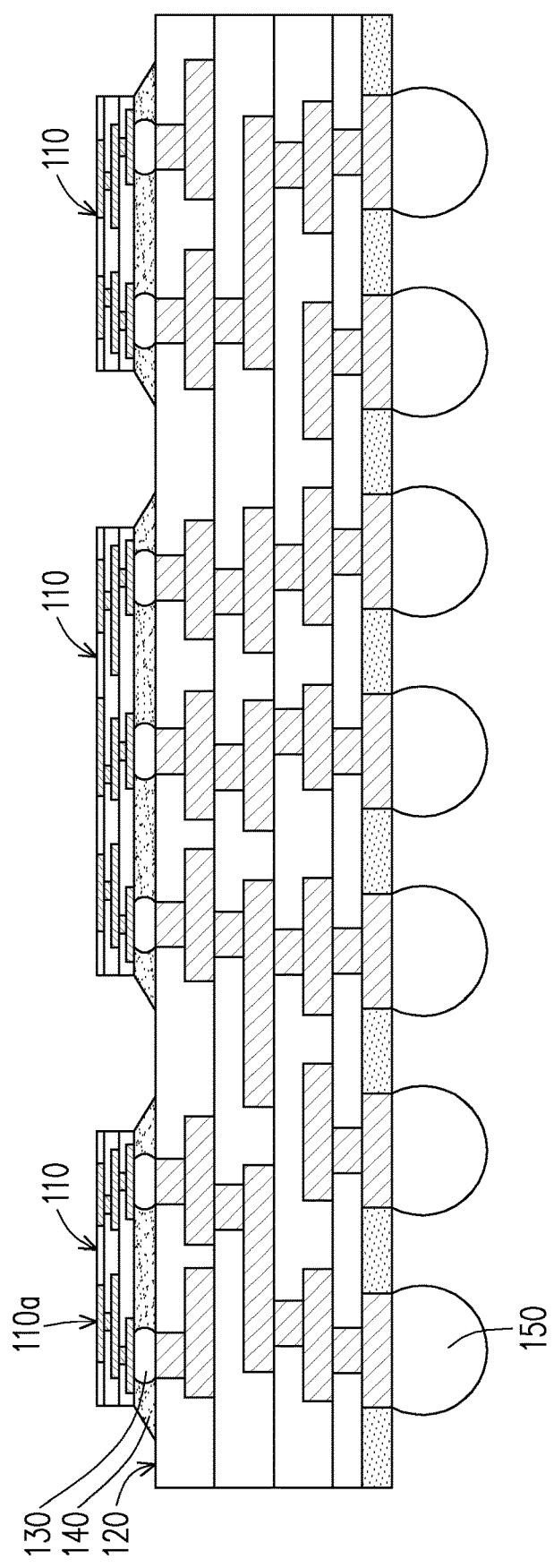

Referring to FIG. 2E and with reference to FIG. 2D, the temporary carrier 5 may be removed to expose the top surface 110a of the respective fine redistribution segment 110. In some embodiments, the underfill layers 140 may be formed between the respective fine redistribution segment 110 and the coarse redistribution structure 120 to surround the conductive connectors 130. Alternatively, the underfill layer is omitted. The external terminals 150 may be formed on the coarse circuitry 122 of the coarse redistribution structure 120 for further electrical connection (e.g., a system board, a mother board, a printed circuit board, etc.). Up to here, the fabrication of the integrated substrate structure 10 is complete.

The integrated substrate structure 10 includes fine redistribution segments 110 which may provide a localized high density routing. In this manner, after chips (not shown) mounted on the top surfaces 110a of the fine redistribution segments 110, the fine redistribution segments 110 permits high bandwidth (e.g., density) chip-to-chip interconnects to be created. In addition, the aforementioned process is compatible with current processing facilities, so that the integrated substrate structure 110 may be fabricated without requiring major changes to the fabrication process. Moreover, the fine redistribution segments 110 and the coarse redistribution structure 120 are separately fabricated. In this manner, significant warpage of the integrated substrate structure 10 is avoided. The fine redistribution segments 110 may remain their geometrical planarity which permits reliable connections between the integrated substrate structure 10 and the subsequently-mounted chips.

Figure 3A:
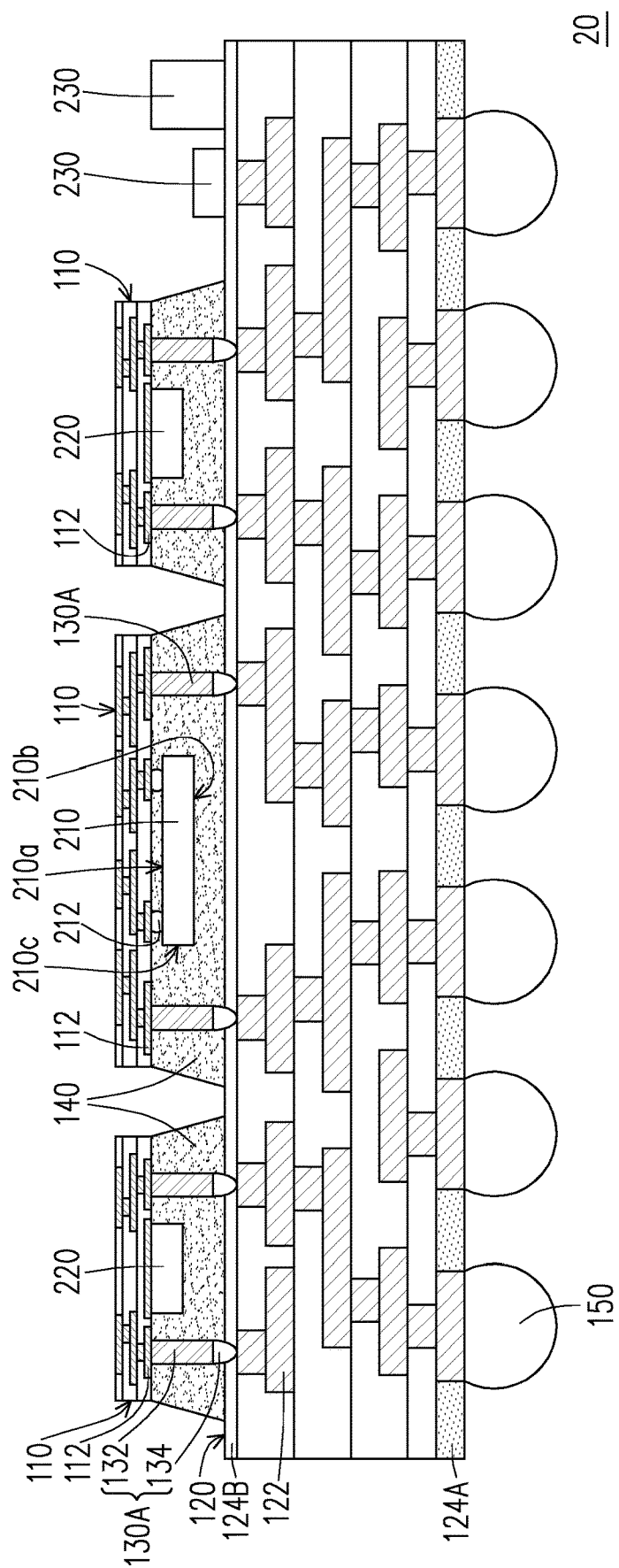
FIG. 3A is a schematic cross-sectional view of an integrated substrate structure in accordance with some embodiments.
Figure 3B:
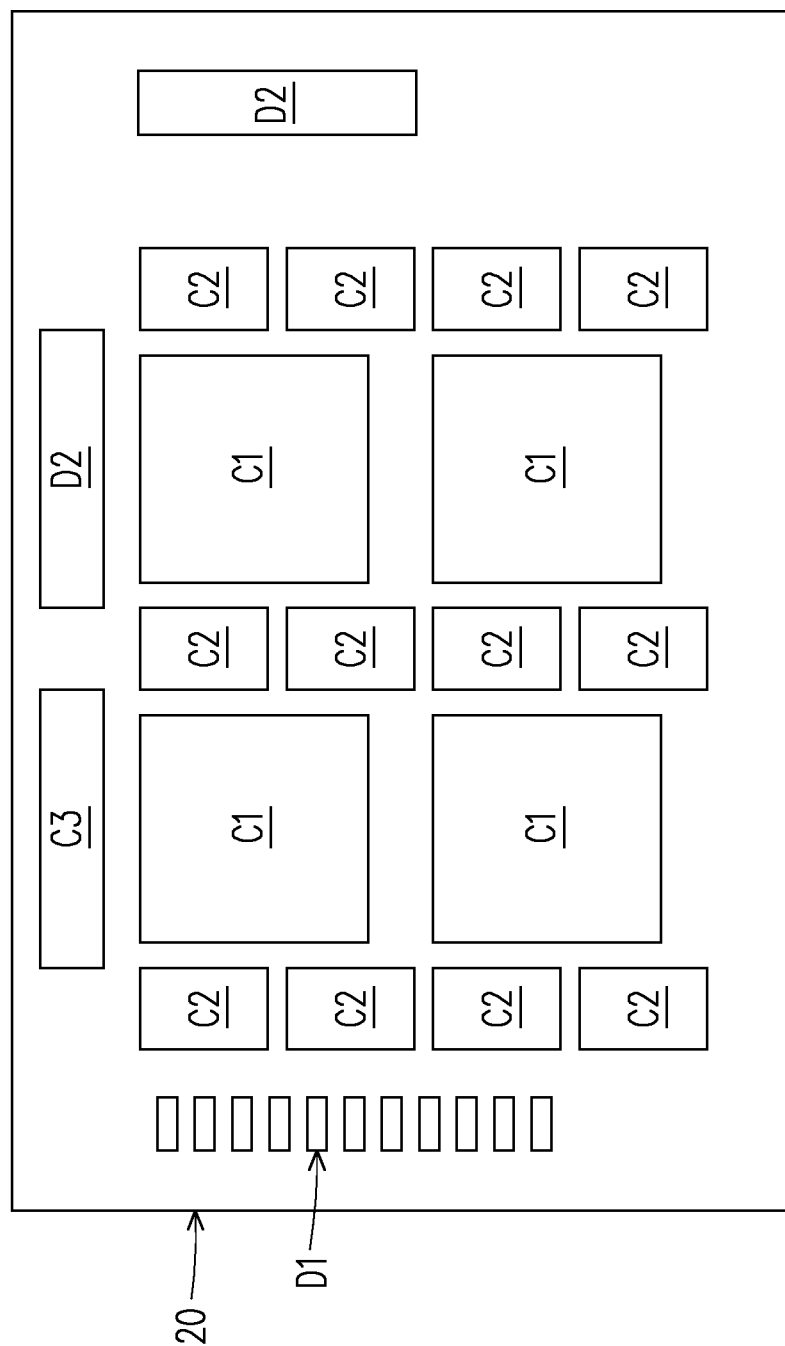
FIG. 3B is a schematic plan view of an integrated substrate structure and various devices mounted thereon in accordance with some embodiments.

FIG. 3A is a schematic cross-sectional view of an integrated substrate structure in accordance with some embodiments, and FIG. 3B is a schematic plan view of an integrated substrate structure and various devices mounted thereon in accordance with some embodiments. It is noted that elements of the integrated substrate structure 20 illustrated in FIG. 3A same as/similar to the elements of the integrated substrate structure 10 illustrated in FIG. 1 are not described again for brevity. Referring to FIG. 3A, the integrated substrate structure 20 includes the fine redistribution segments 110 disposed over the coarse redistribution structure 120, and the external terminals 150 and the fine redistribution segments 110 are disposed at two opposing sides of the coarse redistribution structure 120. The difference between the integrated substrate structure 20 shown in FIG. 3A and the integrated substrate structure 10 shown in FIG. 1 includes that the respective fine redistribution segment 110 is coupled to the coarse redistribution structure 120 through a plurality of conductive connectors 130A, and embedded chip(s)/embedded device(s) may be interposed between the fine redistribution segment 110 and the coarse redistribution structure 120. The integrated substrate structure 20 may also include mounted devices disposed on the periphery of the coarse redistribution structure 120 and next to the conductive connectors 130A.

In some embodiments, the respective conductive connector 130A includes a conductive pillar 132 and a conductive joint 134 connected to the conductive pillar 132, where the conductive pillar 132 is physically and electrically connected to the fine circuitry 112 of the fine redistribution segment 110, and the conductive joint 134 is physically and electrically connected to the conductive pillar 132 and the coarse circuitry 122 of the coarse redistribution structure 120. For example, the conductive pillar 132 and the conductive joint 134 are of different conductive materials. The material of the conductive pillar may include copper, gold, nickel, aluminium, platinum, tin, combinations thereof, an alloy thereof, etc. The material of the conductive joint may include solder or the like. The conductive joint 134 may be formed by initially forming a solder cap on the conductive pillar 132, attaching the solder cap to the solder material (if any) on the coarse circuitry 122, and reflowing the solder to form the conductive joints 134. The fine redistribution segments 110 may be mounted on the coarse redistribution structure 120 after the reflow process performed on the conductive joints 134. In some embodiments, the mask layer 124B, similar to the mask layer 124A, is formed on the coarse dielectric layer 124 and at least laterally covers the conductive joints 134 for protection, where the underfill layers 140 may be formed on the mask layer 124B. Alternatively, the mask layer 124B is omitted.

In some embodiments, an embedded chip 210 is coupled to at least one of the fine redistribution segments 110 through chip connectors 212. For example, the embedded chip 210 includes an active side 210a coupled to the fine redistribution segment 110, a back side 210b facing the coarse redistribution structure 120, and a sidewall 210c connected to the active side 210a and the back side 210b. The chip connectors 212 at the active side 210a may be or may include C4 bumps, micro-bumps, etc., and may be physically and electrically connected to the bottom portion of the fine circuitry 122. The embedded chip 210 may be surrounded by the conductive connectors 130. In some embodiments, the sidewall of the conductive connector 130A may be substantially parallel to the sidewall 210c of the embedded chip 210. The embedded chip 210 may include active circuits (e.g., logic circuits, memory circuits, processor circuits, a combination thereof), passive circuits, or other types of circuits.

In some embodiments, the underfill layer 140 is formed between the coarse redistribution structure 120 and the fine redistribution segment 110 to cover the embedded chip 210 and the conductive connector 130A for protection. The underfill layer 140 may cover the active side 210a to surround the chip connectors 212 and may also cover the back side 210b and the sidewall 210c. That is, the back side 210b of the embedded chip 210 may be spatially apart from the coarse redistribution structure 120 through the underfill layer 140. Alternatively, the back side 210b of the embedded chip 210 is abutted against the coarse redistribution structure 120.

In some embodiments, an embedded device 220, similar to the embedded chip 210, is mounted on another one of the fine redistribution segment 110 and electrically connected to the fin circuitry 112 of the fine redistribution segment 110. The embedded device 220 may be surrounded by the conductive connectors 130A and embedded in the underfill layer 140. The embedded device 220 may be or may include passive device such as resistor, capacitor, and/or inductor, etc. In some embodiments, at least one mounted device 230 is mounted on the coarse redistribution structure 120 and located on the periphery of the coarse redistribution structure 120 that surrounds an array of the fine redistribution segments 110. The mounted device 230 may be or may include active/passive device(s), surface mounted device(s), etc. A plurality of the mounted devices 230 may be provided and may perform the same/similar function as the embedded device 220, in accordance with some embodiments. The embedded chip 210, the embedded device 220, and the mounted device 230 are optionally integrated in the integrated substrate structure 20 to perform various functions depending on the product requirements.

Referring to FIG. 3B and with reference to FIG. 3A, an electronic assembly 200 includes the integrated substrate structure 20 and a plurality of chips/devices mounted on the integrated substrate structure 20. it is also noted that the plan view of the integrated substrate structure 20 labelled in FIG. 3B is drawn in a simplified manner to show the layout configuration of chips/devices, and the integrated substrate structure 20 may have a cross sectional view similar to the structure shown in FIG. 3A.

In some embodiments a plurality of chips (C1, C2, and C3) is mounted onto the integrated substrate structure 20. For example, the fine redistribution segments 110 labelled in FIG. 3A of the integrated substrate structure 20 may interconnect between the chips C1 and C2 (and/or C3) to provide better electrical performance. In some embodiments, the chip C1 is surrounded by the chips C2, where the chip C1 may be any type of IC chip or logic chip, and the chips C2 may be memory chips. Other types of chips may be used. In some embodiments, the chip C3 may be also mounted on the integrated substrate structure 20 and disposed aside the array of the chips C1 and C2, where the chip C3 may be I/O chips. Although chip 3 may be other type of chip or may be omitted. In some embodiments, multiple passive components D1 are mounted onto the integrated substrate structure 20 and disposed next to the array of the chips C1 and C2.

In some embodiments, an optical device D2 is mounted on the integrated substrate structure 20 and disposed next to the chip C3 and the array of the chips C1 and C2. The optical device D2 may be or may include an optical transceiver converting and coupling an information-containing electrical signal with an optical fiber (not shown). Other types of optical device may be used. It is understood that the layout configuration shown in FIG. 3 is only for illustrative purpose, and the number and configuration of devices construe no limitation in the disclosure.

FIGS. 4A-4G are schematic cross-sectional views illustrating a manufacturing method of an integrated substrate structure with embedded chips/devices according to some embodiments. It is noted that the resulting the integrated substrate structure 30 described herein is similar to the integrated substrate structure 20 described in FIG. 3A, and thus the detailed descriptions are simplified.

Figure 4A:
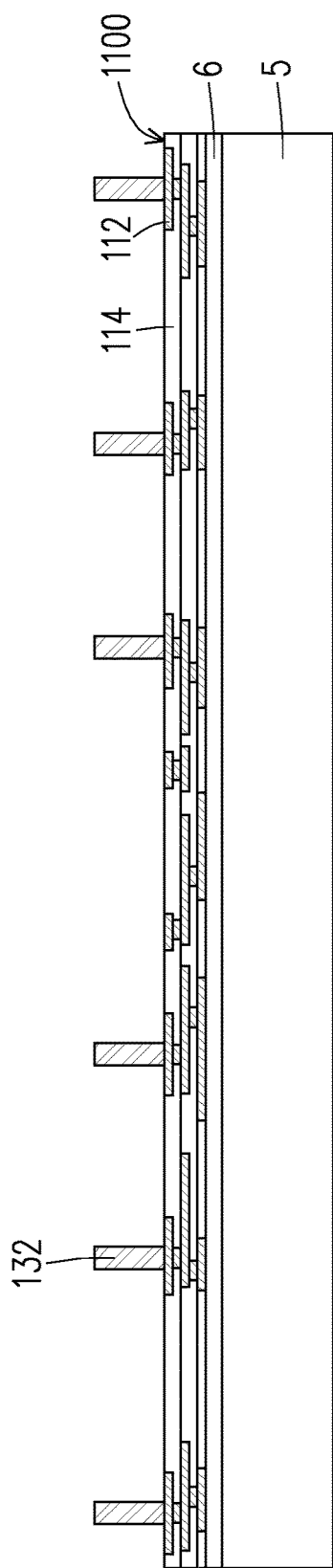
FIGS. 4A-4G are schematic cross-sectional views illustrating a manufacturing method of an integrated substrate structure with embedded chips/devices according to some embodiments.
Figure 4B:
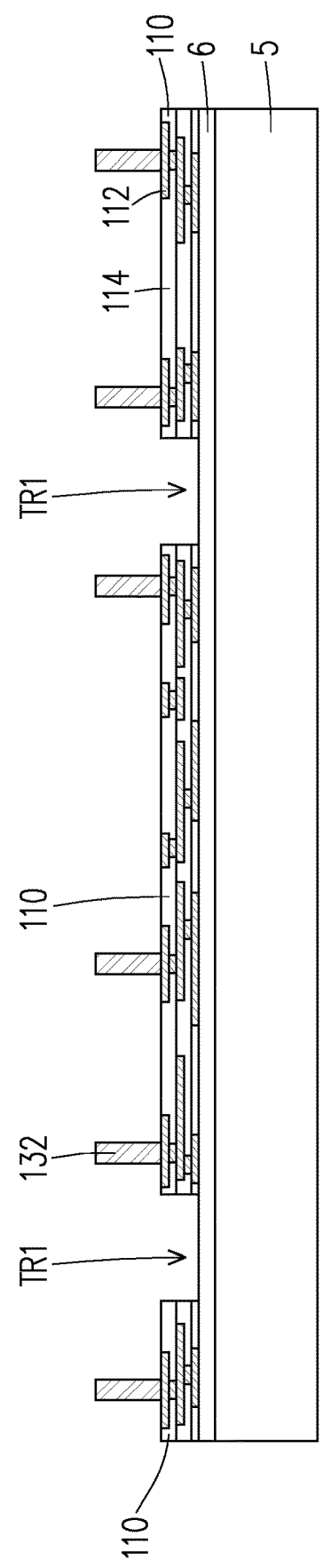

Referring to FIGS. 4A-4B, the fine redistribution structure 110 including a fine dielectric layer 114 and the fine circuitry 112 is formed over the temporary carrier 5 with the release layer 6 interposed therebetween. Next, a plurality of conductive pillars 132 may be formed on the fine circuitry 112 of the fine redistribution structure 1100. The conductive pillars 132 may be plated or may be pre-formed and disposed on the fine circuitry 112. Subsequently, the fine redistribution structure 110 is segmented by removing portions of the fine redistribution structure 1100 to form a plurality of first trenches TR1. The formation of the trenches TR1 may be similar to the process described in FIG. 2C.

Figure 4C:
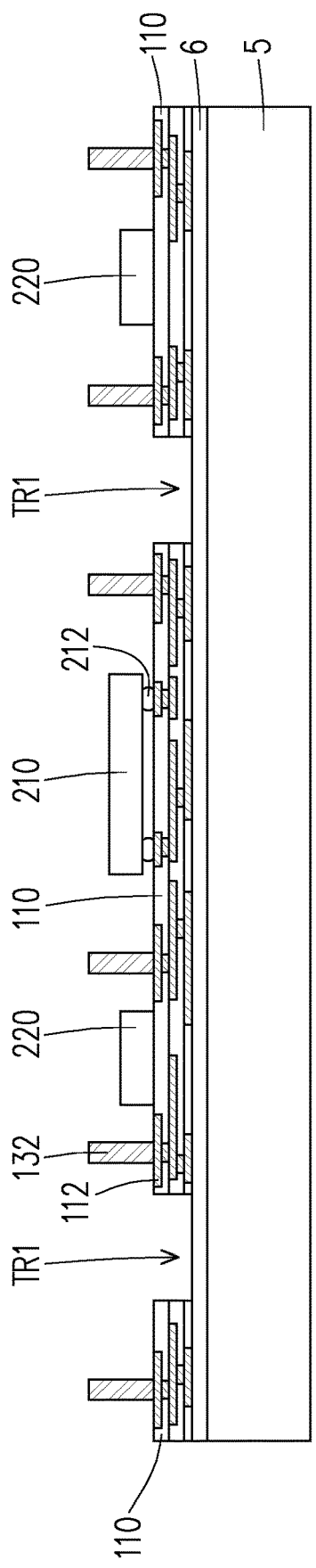
Figure 4D:
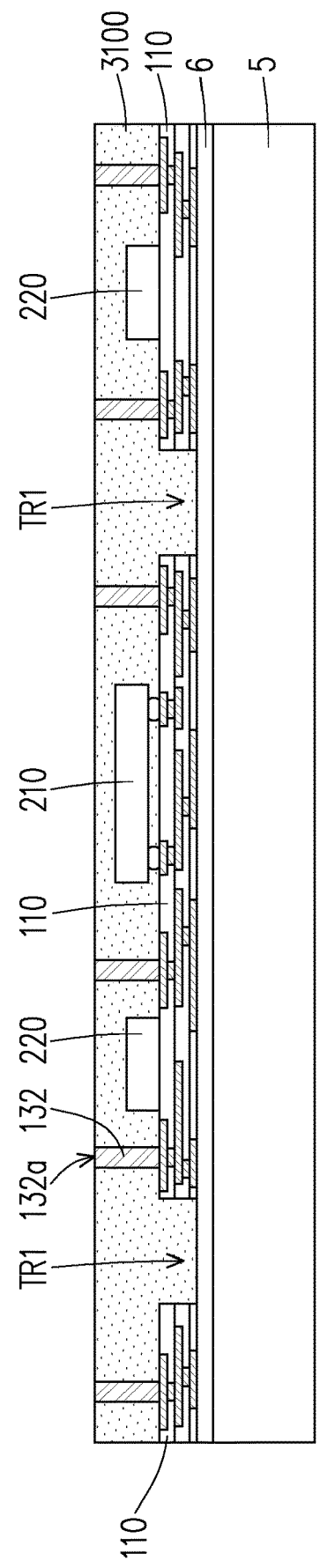

Referring to FIGS. 4C-4D, a plurality of chips and devices may be disposed on the fine redistribution segments 110. Each of the chips and devices may be surrounded by the conductive pillars 132. Next, an insulating layer 3100 may be formed over the temporary carrier 5 to cover the fine redistribution segments 110, the conductive pillars 132, the chips 210, and the devices 220. Since the chips and devices are embedded in the insulating layer 3100, the chips may be viewed as the embedded chips 210 and the devices may be viewed as the embedded devices 220. In some embodiments, the insulating layer 3100 also fills the first trenches TR1. The insulating layer 3100 may be or may include molding compound, molding film, or liquid molding compound, and may be formed by a molding process or other suitable process. Other types of insulating material may be used. In some embodiments, a grinding process is performed on the insulating layer 3100 to expose at least the top surfaces 132a of the conductive pillars 132 for further electrical connection. In some embodiments, a surface finishing process is performed on the top surfaces of the conductive pillars for the subsequently mounting process.

Figure 4E:
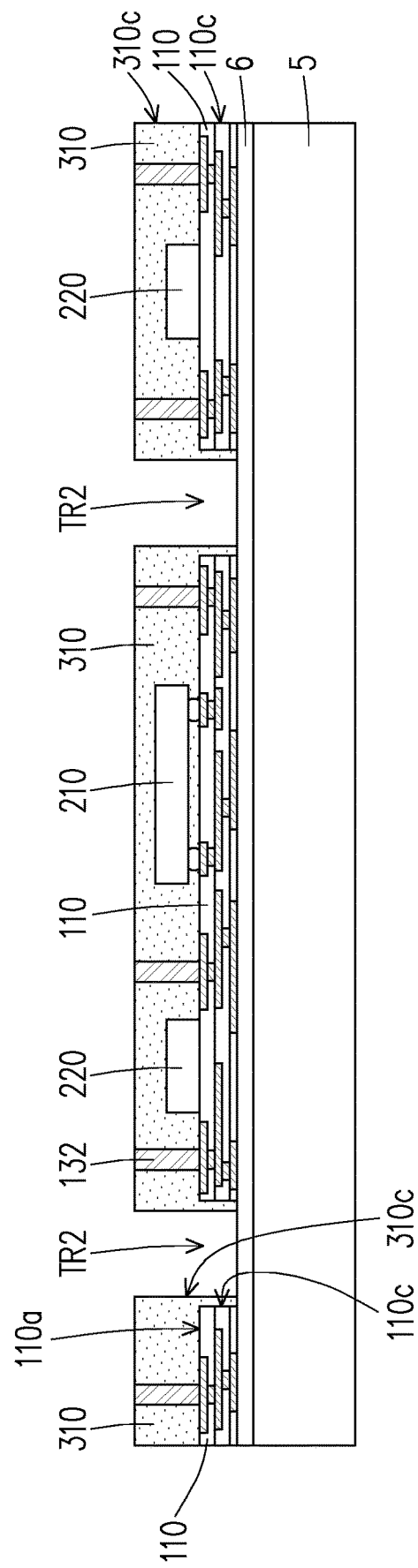

Referring to FIG. 4E and with reference to FIG. 4D, the insulating layer 3100 is segmented by removing portions of the insulating layer 3100 to form a plurality of second trenches TR2, where the locations of the second trenches TR2 correspond to the location of the first trenches TR1. The width of the respective second trench TR2 may be less than that of the corresponding first trench TR1. For example, the laser energy is applied to the insulating layer 3100 to form the second trenches TR2. Other suitable removal techniques (e.g., mechanical removal, etching, etc.) may be used depending on the material of the insulating layer 3100. The second trenches TR2 may spatially separate the insulating segments 310 from one another. The width of the respective second trench TR2 may be controlled so that the respective insulating segment 310 laterally covers the fine redistribution segment 110. For example, at least one side of the sidewall 110c of the respective fine redistribution segment 110 is covered by the corresponding insulating segment 310, and the sidewall 110c and the sidewall 310c may be substantially aligned with each other. Alternatively, the fine redistribution segment 110 is fully wrapped by the insulating segment 310. For example, the insulating segment 310 covers the sidewall 110c and the top surface 110a of the fine redistribution segment 110, where the insulating segment 310 may be in direct contact with the fine circuitry 112 exposed by the fine dielectric layer 114 at the sidewall 110c.

Figure 4F:
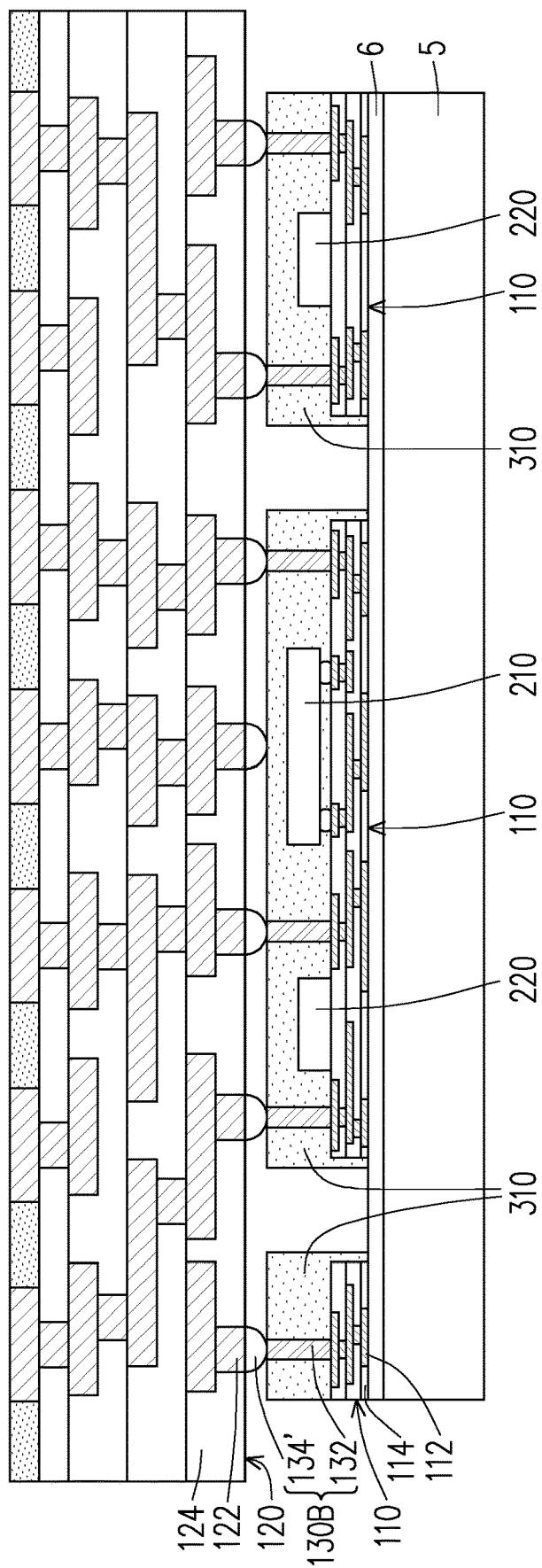

Referring to FIG. 4F, the coarse redistribution structure 120 is then mounted onto the resulting structure shown in FIG. 4E. In some embodiments, the coarse circuitry 122 of the coarse redistribution structure 120 is coupled to the conductive pillars 132 through the conductive joints 134'. For example, the solder bumps are initially formed on the topmost portion of the coarse circuitry 122, and then the solder bumps are disposed on the conductive pillars 132 and reflowed to form the conductive joints 134'. The conductive pillar 132 and the conductive joint 134' overlying the conductive pillar 132 may be collectively viewed as the conductive connector 130B. Compared to the conductive connector 130A shown in FIG. 3A, the conductive pillar 132 of the conductive connector 130B is laterally covered by the insulating segment 310 and the conductive joint 134' is exposed by the insulating segment 310. For example, the contact interface between the conductive joint 134' and the coarse circuitry 122 is greater than the contact interface between the conductive joint 134' and the conductive pillar 132.

Figure 4G:
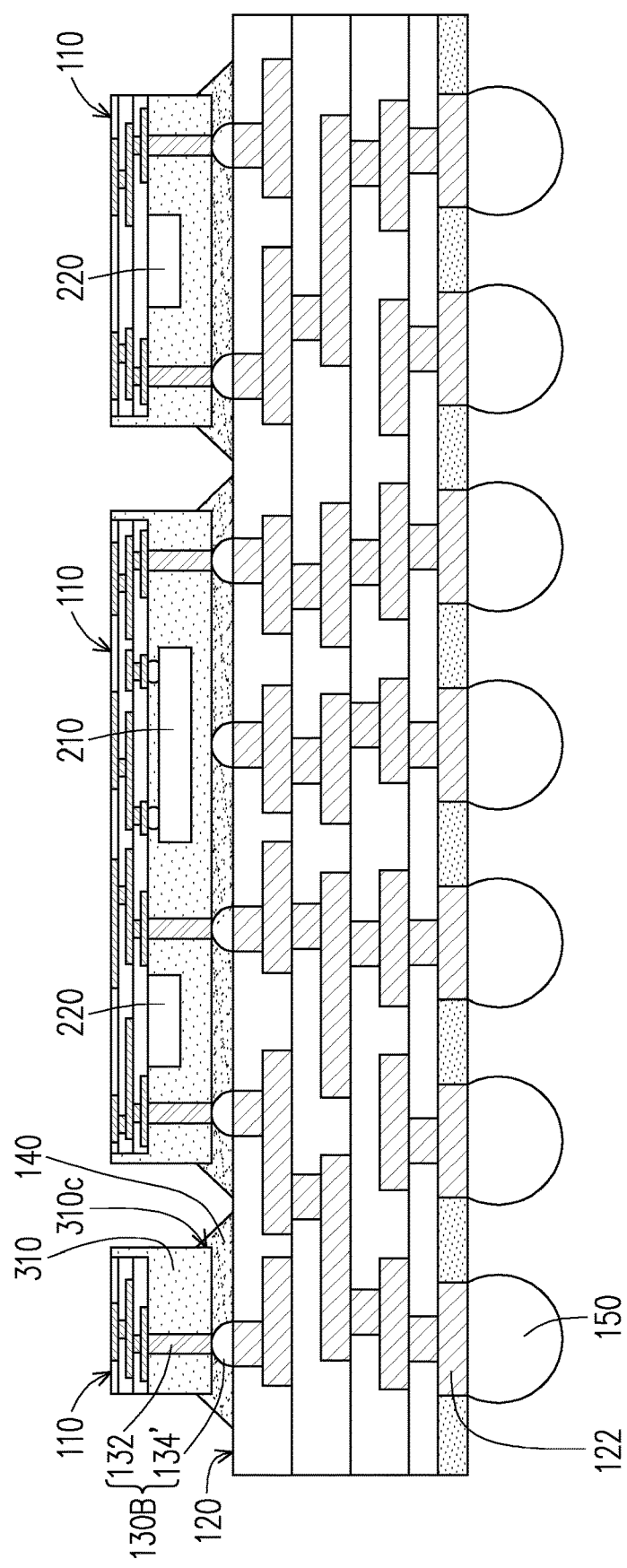

Referring to FIG. 4G and with reference to FIG. 4F, the temporary carrier 5 may be removed to expose the fine circuitry 112 and the fine dielectric layer 114 of the respective fine redistribution segment 110. The removal of the temporary carrier 5 may be similar to the process described previously, and thus the details thereof are omitted. In some embodiments, the underfill layers 140 may be formed between the insulating segments 310 and the coarse redistribution structure 120 to surround the conductive joints 134' for protection. For example, the underfill layer 140 may extend to cover the bottom of the sidewall 310c of the insulating segment 310. Alternatively, the underfill layers 140 may be omitted. The external terminals 150 are optionally formed on coarse circuitry 122 of the coarse redistribution structure 120 for further electrical connection. Up to here, the fabrication of the integrated substrate structure 30 with the embedded chips 210 and the embedded devices 220 is complete. Since the respective fine redistribution segment 110 is covered by the corresponding insulating segment 310, the insulating segment 310 may provide rigid protection to the fine redistribution segment 110 so as to enhance the reliability.

Figure 5A:
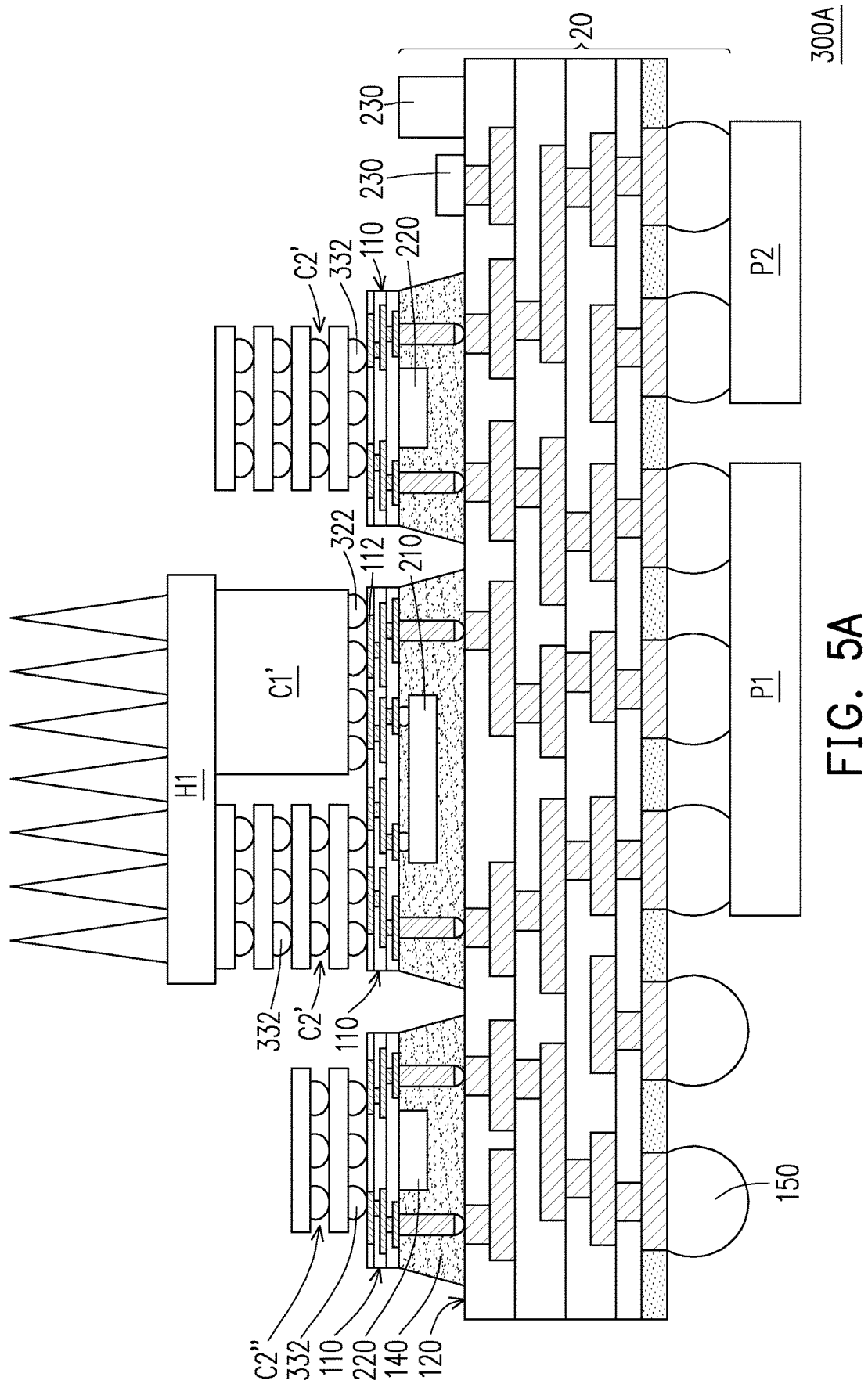
FIG. 5A and FIG. 5B are schematic cross-sectional views of an application of an integrated substrate structure in accordance with some embodiments.
Figure 5B:
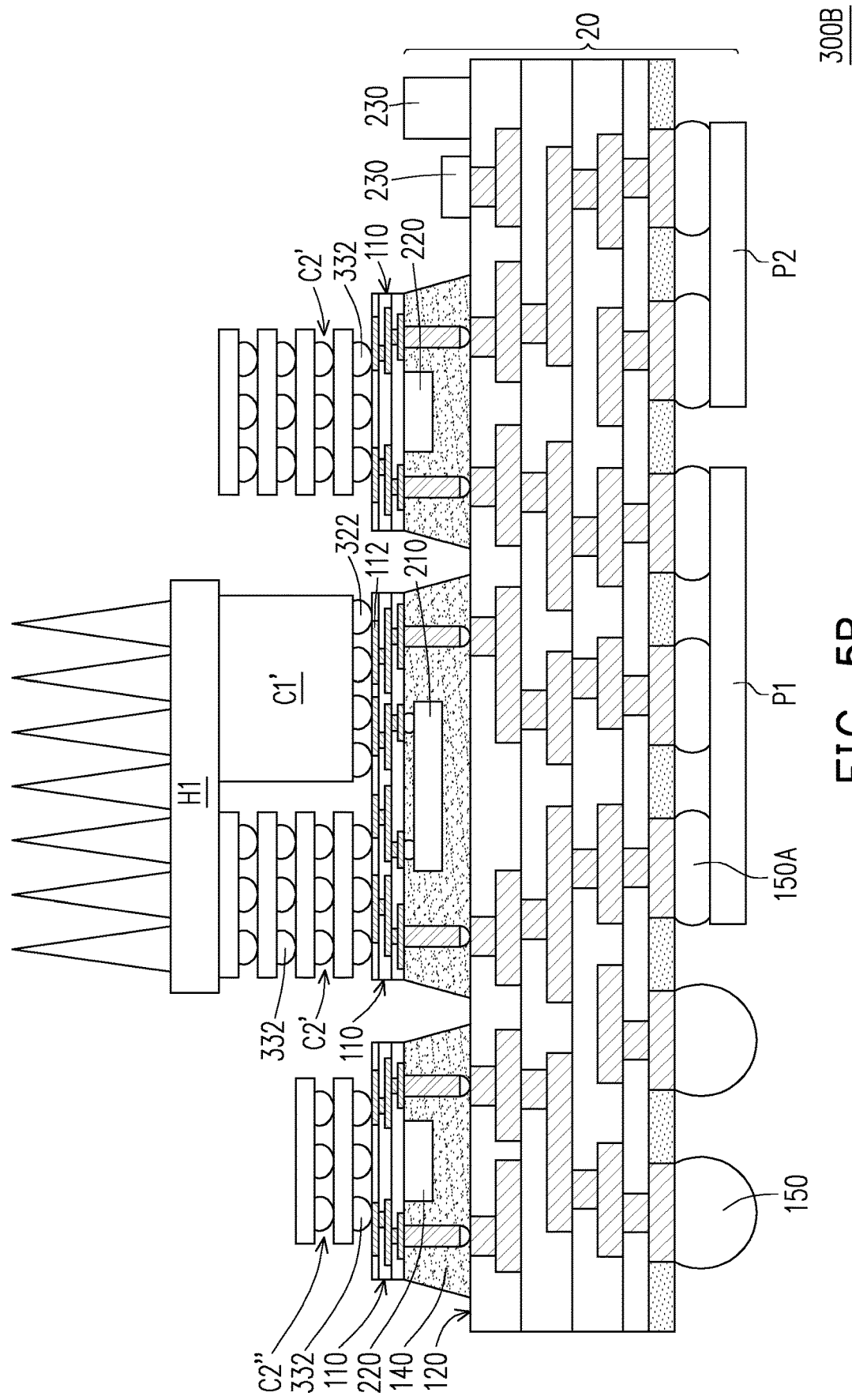

FIGS. 5A-5B are schematic cross-sectional views of an application of an integrated substrate structure in accordance with some embodiments. The integrated substrate structure 20 shown in FIGS. 5A-5B is similar to the integrated substrate structure 20 shown in FIG. 3A, so the detailed descriptions are not repeated. It should be understood that the integrated substrate structure 20 may be replaced with the integrated substrate structure 10 shown in FIG. 1, the integrated substrate structure 30 shown in FIG. 4G, or other integrated substrate structure described elsewhere in the disclosure, in accordance with some embodiments.

Referring to FIG. 5A, various components may be mounted onto the integrated substrate structure 20 to form an electronic assembly 300A depending on product requirements. For example, an IC chip C1' is disposed on and electrically connected to one of the fine redistribution segments 110, where the chip connectors 322 are physically and electrically connected to the fine circuitry 112. In some embodiments, one or more than one 3D-IC chip stack C2' may be disposed on the fine redistribution segment 110, where the chip connectors 332 are physically and electrically connected to the fine circuitry 112. For example, one of the 3D-IC chip stacks C2' is disposed on one of the fine redistribution segments110 and next to the IC chip C1', and the one of the fine redistribution segments 110 interconnects the one of the 3D-IC chip stacks C2' and the IC chip C1'. For example, the embedded chips 210 may interact with the one of the 3D-IC chip stacks C2' and the IC chip C1' through the fine circuitry 112. Another one of the 3D-IC chip stacks C2' may be disposed on and electrically connected to another one of the fine redistribution segments 110, and the embedded device 220 may interact with the another one of the 3D-IC chip stacks C2' through the fine circuitry 112 of the another one of the fine redistribution segments 110.

It should be noted that various 3D-IC chip stacks may be employed. For example, the other one of the 3D-IC chip stacks C2" may be disposed on and electrically connected to the other one of the fine redistribution segments 110, and the embedded device 220 may interact with the other one of the 3D-IC chip stacks C2" through the fine circuitry 112 of the other one of the fine redistribution segments 110. In some embodiments, a heat sink H1 may be disposed on the one of the 3D-IC chip stacks C2' and the IC chip C1' for thermal management. It is noted that the type of the heat sink illustrated in FIG. 5A is an example and construes no limitation in the disclosure. In some embodiments, a power supply module P1 is coupled to the coarse redistribution structure 120 through the external terminals 150. For example, the IC chip C1' and the 3D-IC chip stacks (C2' and C2") are disposed at one side of the integrated substrate structure 20, and the power supply module P1 is disposed at the opposing side of the integrated substrate structure 20. The IC chip C1' and the 3D-IC chip stacks (C2' and C2") may be electrically coupled to the power supply module P1 through the integrated substrate structure 20. A semiconductor device P2 is optionally disposed next to the power supply module P1 and also electrically coupled to the coarse redistribution structure 120 through the external terminals 150. The semiconductor device P2 may be (or include) active/passive component(s), optical component(s), or various mounted devices depending on product requirements. It is understood that the configuration shown in FIG. 5A is only for illustrative purpose, and the number and configuration of devices mounted onto the integrated substrate construe no limitation in the disclosure.

Referring to FIG. 5B, an electronic assembly 300B is similar to the electronic assembly 300A, and the difference therebetween includes that the external terminals may be provided with different sizes. For example, a plurality of external terminals 150A are connected to the power supply module P1 and/or the semiconductor device P2, and the external terminals 150 are to be connected to other electrical component (not shown). In some embodiments, during the formation of the external terminals (150 and 150A), a greater amount of solder material are applied to those locations for the external terminals 150, and a less amount of solder material are applied to those locations for the external terminals 150A. The external terminals 150A may have the size (and/or the spacing) less than the size (and/or the spacing) of the external terminals 150.

FIG. 6A is a schematic plane view of a substrate layer including heat-dissipating features in accordance with some embodiments, and FIG. 6B is a schematic cross-sectional view of the substrate layer of FIG. 6A. Referring to FIGS. 6A-6B, a substrate layer 1200 includes at least one heat-dissipating feature HF embedded in a dielectric layer 1240. The dielectric layer 1240 may be a firm polymer layer, such as polypropylene or the like. The dielectric layer 1240 may include a composite material, such as a ceramic mixture. For example, the heat-dissipating features HF include ceramic (e.g., alumina, alumina nitride, etc.), glass, and/or other heat-dissipating material(s) such as isolated copper slug. In some embodiments, a plurality of the substrate layers 1200 may be stacked upon one another to form a coarse dielectric layer of a coarse redistribution structure (e.g., "120" described above). The heat-dissipating features HF fully embedded in the dielectric layer 1240 may enhance the mechanical strength of the substrate layer 1200 and also improve the capability of heat dissipation. The greater details will be discussed below.

Figure 7:
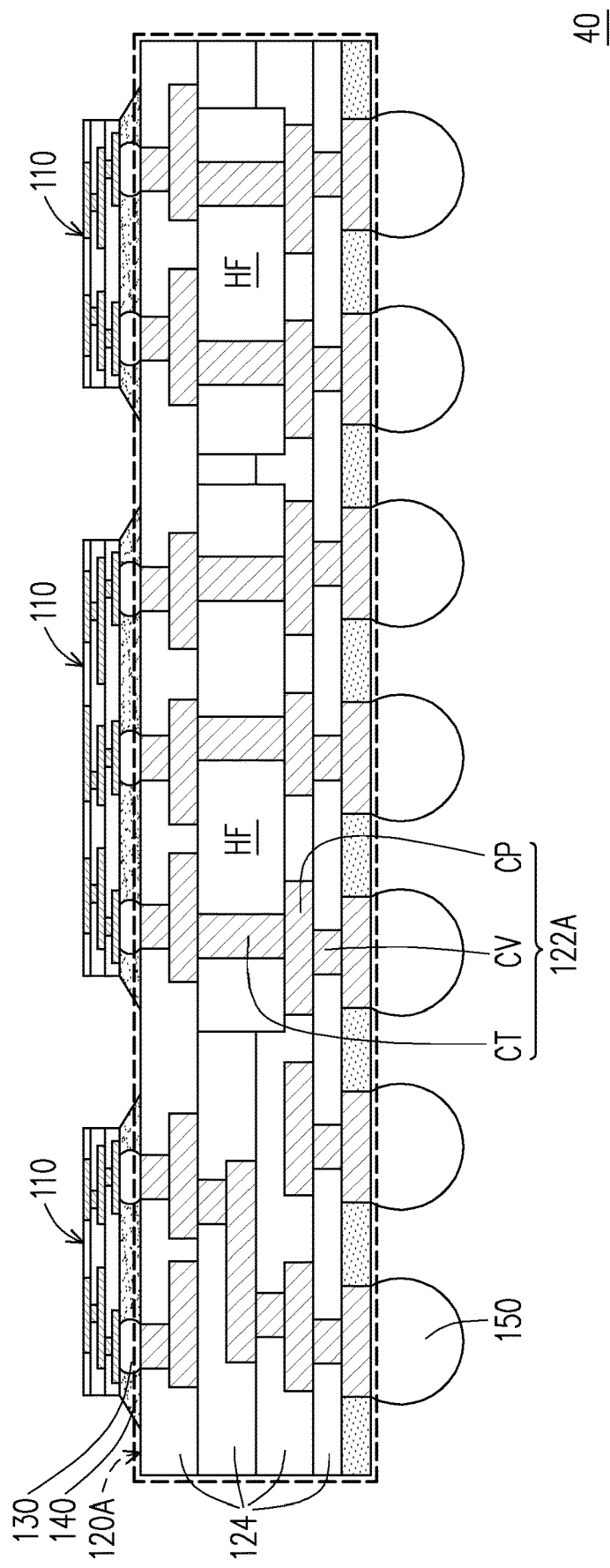
FIG. 7 is a schematic cross-sectional view of an integrated substrate structure including a substrate layer in accordance with some embodiments.

FIG. 7 is a schematic cross-sectional view of an integrated substrate structure including a substrate layer in accordance with some embodiments. The integrated substrate structure 40 shown in FIG. 7 is similar to the integrated substrate structure 10 shown in FIG. 1, except for the coarse redistribution structure 120A. Therefore, the details of the integrated substrate structure are simplified herein. Referring to FIG. 7, the coarse redistribution structure 120A of the integrated substrate structure 40 includes at least one heat-dissipating feature HF embedded inside the coarse dielectric layer 124. It is noted that the number and configuration of the heat-dissipating features HF are shown only for illustrative purpose and construe no limitation in the disclosure.

In some embodiments, the coarse circuitry 122A of the coarse redistribution structure 120A includes conductive through vias CT penetrating through the heat-dissipating feature HF for vertically connection between the coarse conductive patterns CP. In some embodiments, the top surface and the bottom surface of the heat-dissipating feature HF are in direct contact with the coarse conductive patterns CP, and the sidewall of the heat-dissipating feature HF is covered by the sublayer(s) of the coarse dielectric layer 124. In some embodiments, the respective conductive through via CT extends longer than the respective coarse conductive via CV. Alternatively, the conductive through via CT may have similar height to the height of the coarse conductive via CV, depending on the thickness of the heat-dissipating feature HF. It is also noted that the coarse redistribution structure 120A shown in FIG. 7 may be employed to other variations of integrated substrate structure discussed herein.

Figure 8:
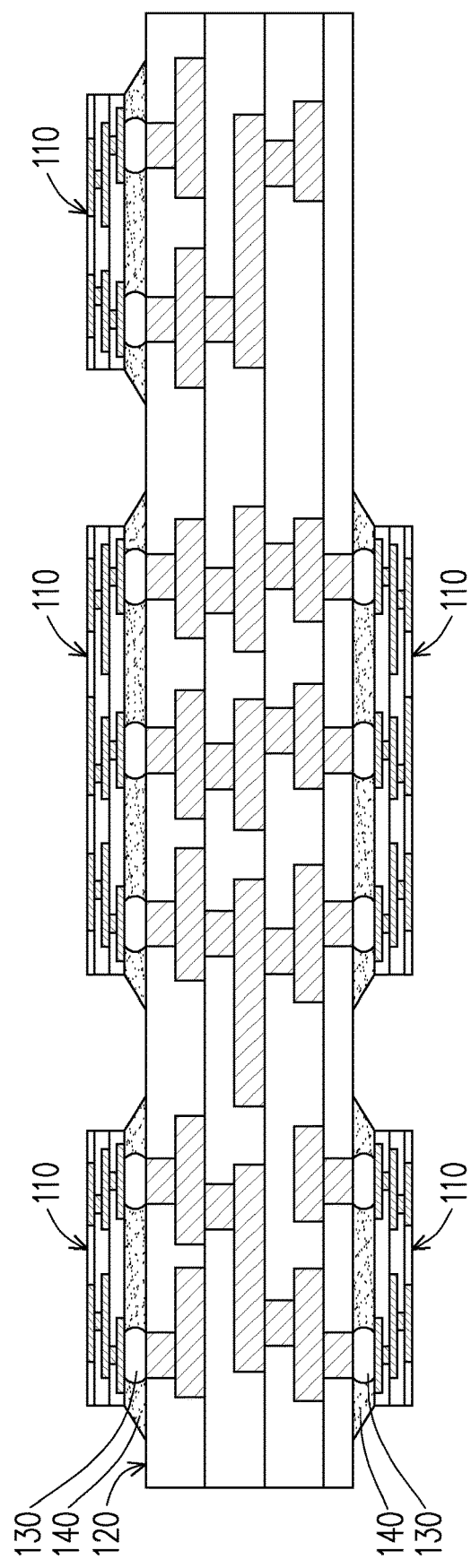
FIGS. 8-9 are schematic cross-sectional views of a double-sided integrated substrate structure in accordance with some embodiments.
Figure 9:
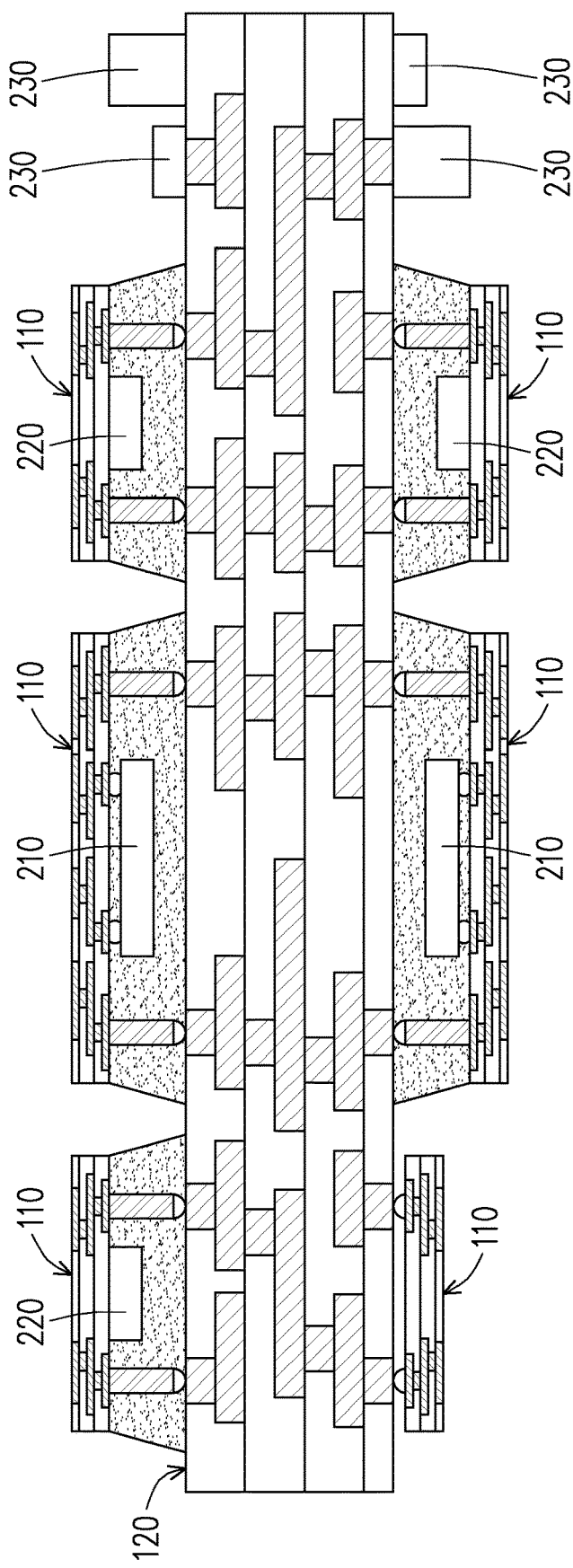

FIGS. 8-9 are schematic cross-sectional views of a double-sided integrated substrate structure in accordance with some embodiments. Referring to FIG. 8, a double-sided integrated substrate structure 50 is similar to the integrated substrate structure 10 shown in FIG. 1, except that the double-sided integrated substrate structure 50 includes the fine redistribution segments 110 disposed on two opposing sides of the coarse redistribution structure 120. The respective fine redistribution segment is electrically coupled to the coarse redistribution structure 120 through the conductive connectors 130. It should be noted that the conductive connectors 130 may be replaced with other type of conductive connectors described elsewhere in the disclosure. The external terminals 150 shown in FIG. 1 may be thus omitted. The double-sided integrated substrate structure 50 may be configured to be coupled to various chips/devices/components to perform various functions depending on product requirements.

Referring to FIG. 9, a double-sided integrated substrate structure 60 is similar to the integrated substrate structure 20 shown in FIG. 3A, so the details thereof are omitted. The difference between the double-sided integrated substrate structure 60 and the integrated substrate structure 20 includes that the fine redistribution segments 110 are disposed at two opposing sides of the coarse redistribution structure 120. The external terminals 150 shown in FIG. 3A may be omitted. For example, the fine redistribution segments 110, and the embedded chips 210 and the embedded device 220 interposed between the fine redistribution segments 110 and the coarse redistribution structure 120 may be formed at the bottom side of the coarse redistribution structure 120. In some embodiments, the embedded chip/device may not be interposed between the fine redistribution segment 110 and the coarse redistribution structure 120. In some embodiments, the mounted devices 230 may be provided at the bottom side of the coarse redistribution structure 120.

Based on the above, the integrated substrate structure including the coarse redistribution structure and the fine redistribution segments mounted thereon may be electrically coupled to various components (e.g., IC chips, passive devices, optical devices, etc.). The fine redistribution segments may be formed to have fine pitches so as to meet the I/O pitch requirements of various chips. The fine redistribution segments may be located at the intended locations on the coarse redistribution structure for interconnecting the chips/devices on the corresponding fine redistribution segments, thereby shortening the signal transmission path between the chips/devices. The coarse redistribution structure may be rigid enough to provide the mechanical support of the integrated substrate structure. In addition, the respective fine redistribution segment may be encapsulated by the insulating segment to enhance the overall mechanical strength. Moreover, the chips/devices may be interposed between the fine redistribution segment and the coarse redistribution structure and embedded inside the underfill layer or the insulating segment to form the embedded chips/devices that may enhance the functionality of the integrated substrate structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An integrated substrate structure for coupling a fine-pitched chip, comprising:
   a coarse redistribution structure comprising a coarse dielectric layer and a coarse circuitry embedded in the coarse dielectric layer;
   a plurality of fine redistribution segments disposed over the coarse redistribution structure and coupled to the fine-pitched chip, the plurality of fine redistribution segments being disposed side by side and spatially apart from one another, each of the plurality of fine redistribution segments comprising:

a fine dielectric layer being thinner than the coarse dielectric layer; and
a fine circuitry embedded in the fine dielectric layer, the fine circuitry comprising a dimension and a pitch finer than those of the coarse circuitry of the coarse redistribution structure, and a layout density of the fine circuitry being denser than a layout density of the coarse circuitry;
a plurality of conductive connectors interposed between and in direct contact with the coarse redistribution structure and the plurality of fine redistribution segments, and the coarse circuitry being electrically coupled to the fine circuitry through the plurality of conductive connectors, wherein each of the plurality of conductive connectors comprises a solder joint; and
a plurality of underfill layers interposed between the coarse redistribution structure and the plurality of fine redistribution segments, wherein each of the plurality of underfill layers surrounds and directly contacts the corresponding plurality of conductive connectors located between the coarse redistribution structure and the corresponding plurality of fine redistribution segments, wherein the plurality of underfill layers spatially apart from one another.

2. The integrated substrate structure of claim 1, further comprising:
an embedded chip interposed between the coarse redistribution structure and the one of the plurality of fine redistribution segments, and the embedded chip being physically and electrically connected to the fine circuitry of the one of the plurality of fine redistribution segments,
wherein the embedded chip and the conductive connectors surrounding the embedded chip being embedded in one of the plurality of underfill layers.

3. The integrated substrate structure of claim 2, wherein each of the plurality of conductive connectors which surrounds the embedded chip further comprises:
a conductive pillar physically and electrically connected to the fine circuitry of the one of the plurality of fine redistribution segments,
wherein the solder joint is underlying the conductive pillar and physically and electrically connected to the coarse circuitry of the coarse redistribution structure.

4. The integrated substrate structure of claim 1, further comprising:
a plurality of insulating segments spatially apart from one another, each of the plurality of fine redistribution segments being encapsulated by one of the plurality of insulating segments, and the plurality of insulating segments being spatially apart from the coarse redistribution structure.

5. The integrated substrate structure of claim 4, wherein:
the one of the plurality of fine redistribution segments comprises a top surface, a bottom surface opposite to the top surface, and a sidewall connected to the top surface and the bottom surface, and
a corresponding one of the plurality of insulating segments covers the sidewall and the bottom surface of the one of the plurality of fine redistribution segments, and the plurality of conductive connectors which are connected to the bottom surface of the one of the plurality of fine redistribution segments are embedded in the corresponding one of the plurality of insulating segments.

6. The integrated substrate structure of claim 5, wherein the top surface of the one of the plurality of fine redistribution segments is substantially coplanar with a top surface of the corresponding one of the plurality of insulating segments.

7. The integrated substrate structure of claim 4, further comprising:
an embedded chip interposed between the coarse redistribution structure and the one of the plurality of fine redistribution segments and embedded inside one of the plurality of insulating segments, and the embedded chip being physically and electrically connected to the fine circuitry of the one of the plurality of fine redistribution segments,
wherein one of the plurality of underfill layers interposed between the coarse redistribution structure and the one of the plurality of insulating segments.

8. The integrated substrate structure of claim 1, further comprising:
a heat-dissipating feature embedded inside the coarse redistribution structure, wherein the coarse circuitry comprises coarse conductive patterns stacked upon one another and a conductive through via vertically connected the coarse conductive patterns, and the conductive through via penetrates through the heat-dissipating feature which is laterally covered by the coarse dielectric layer.

9. The integrated substrate structure of claim 1, wherein the coarse redistribution structure comprises a top side and a bottom side, a portion of the plurality of fine redistribution segments is disposed at the top side of the coarse redistribution structure, and another portion of the plurality of fine redistribution segments is disposed at the bottom side of the coarse redistribution structure.

10. The integrated substrate structure of claim 9, further comprising:
an embedded chip interposed between the coarse redistribution structure and the one of the plurality of fine redistribution segments disposed at the top side, and the embedded chip being physically and electrically connected to the fine circuitry of the one of the plurality of fine redistribution segments,
wherein the embedded chip and the conductive connectors surrounding the embedded chip being embedded in one of the plurality of underfill layers.

11. An electronic assembly, comprising:
an integrated substrate structure according to claim 1; and
a chip structure disposed on and electrically connected to one of the plurality of fine redistribution segments of the integrated substrate structure; and
a power supply module disposed below and electrically coupled to the coarse redistribution structure.

12. The integrated substrate structure of claim 3, wherein the one of the plurality of underfill layers encloses a side surface of the conductive pillar and the solder joint is physically and electrically connected to the conductive pillar.

13. An integrated substrate structure for coupling a fine-pitched chip, comprising:
a coarse redistribution structure comprising a coarse dielectric layer and a coarse circuitry embedded in the coarse dielectric layer;
a plurality of fine redistribution segments disposed over the coarse redistribution structure and coupled to the fine-pitched chip, the plurality of fine redistribution segments being disposed side by side and spatially apart from one another, each of the plurality of fine redistribution segments comprising:

a fine dielectric layer being thinner than the coarse dielectric layer; and a fine circuitry embedded in the fine dielectric layer, the fine circuitry comprising a dimension and a pitch finer than those of the coarse circuitry of the coarse redistribution structure, and a layout density of the fine circuitry being denser than a layout density of the coarse circuitry;

a plurality of conductive connectors interposed between the coarse redistribution structure and the plurality of fine redistribution segments, and the coarse circuitry being electrically coupled to the fine circuitry through the plurality of conductive connectors, wherein each of the plurality of conductive connectors comprises a solder joint;

an underfill layer interposed between the coarse redistribution structure and one of the plurality of fine redistribution segments, wherein the underfill layer surrounds and directly contacts the corresponding plurality of conductive connectors located between the coarse redistribution structure and the one of the plurality of fine redistribution segments; and a plurality of insulating segments spatially apart from one another, each of the plurality of fine redistribution segments being encapsulated by one of the plurality of insulating segments, and the plurality of insulating segments being spatially apart from the coarse redistribution structure, wherein the plurality of conductive connectors which are connected to the one of the plurality of fine redistribution segments are embedded in the corresponding one of the plurality of insulating segments.

14. The integrated substrate structure of claim 13, wherein each of the plurality of conductive connectors further comprises:

a conductive pillar physically and electrically connected to the fine circuitry of the one of the plurality of fine redistribution segments, wherein the one of the plurality of insulating segments encloses a side surface of the conductive pillar, and the solder joint is underlying the conductive pillar and physically and electrically connected to the coarse circuitry of the coarse redistribution structure and the conductive pillar.

15. An integrated substrate structure for coupling a fine-pitched chip, comprising:

a coarse redistribution structure comprising a coarse dielectric layer and a coarse circuitry embedded in the coarse dielectric layer;

a plurality of fine redistribution segments disposed over the coarse redistribution structure and coupled to the fine-pitched chip, the plurality of fine redistribution segments being disposed side by side and spatially apart from one another, each of the plurality of fine redistribution segments comprising:

a fine dielectric layer being thinner than the coarse dielectric layer; and a fine circuitry embedded in the fine dielectric layer, the fine circuitry comprising a dimension and a pitch finer than those of the coarse circuitry of the coarse redistribution structure, and a layout density of the fine circuitry being denser than a layout density of the coarse circuitry;

a plurality of conductive connectors interposed between the coarse redistribution structure and the plurality of fine redistribution segments, and the coarse circuitry being electrically coupled to the fine circuitry through the plurality of conductive connectors, wherein each of the plurality of conductive connectors comprises a solder joint;

an underfill layer interposed between the coarse redistribution structure and one of the plurality of fine redistribution segments, wherein the underfill layer surrounds and directly contacts the corresponding plurality of conductive connectors located between the coarse redistribution structure and the one of the plurality of fine redistribution segments; and an embedded chip interposed between the coarse redistribution structure and the one of the plurality of fine redistribution segments, and the embedded chip being physically and electrically connected to the fine circuitry of the one of the plurality of fine redistribution segments, wherein the embedded chip and the conductive connectors surrounding the embedded chip being embedded in the underfill layer and the underfill layer encloses side surfaces and a bottom surface of the embedded chip.

16. The integrated substrate structure of claim 15, wherein each of the plurality of conductive connectors which surrounds the embedded chip further comprises:

a conductive pillar physically and electrically connected to the fine circuitry of the one of the plurality of fine redistribution segments, wherein the underfill layer encloses a side surface of the conductive pillar, and the solder joint is underlying the conductive pillar and physically and electrically connected to the coarse circuitry of the coarse redistribution structure and the conductive pillar.

* * * * *